US012204921B2

(12) United States Patent
Crabtree et al.

(10) Patent No.: US 12,204,921 B2
(45) Date of Patent: *Jan. 21, 2025

(54) SYSTEM AND METHODS FOR CREATION AND USE OF META-MODELS IN SIMULATED ENVIRONMENTS

(71) Applicant: QOMPLX LLC, Reston, VA (US)

(72) Inventors: Jason Crabtree, Vienna, VA (US); Andrew Sellers, Monument, CO (US)

(73) Assignee: QOMPLX LLC, Reston, VA (US)

( * ) Notice: Subject to any disclaimer, the term of this patent is extended or adjusted under 35 U.S.C. 154(b) by 838 days.

This patent is subject to a terminal disclaimer.

(21) Appl. No.: 17/355,499

(22) Filed: Jun. 23, 2021

(65) Prior Publication Data

US 2022/0019451 A1    Jan. 20, 2022

Related U.S. Application Data

(63) Continuation-in-part of application No. 15/882,180, filed on Jan. 29, 2018, now Pat. No. 11,055,601, which is a continuation-in-part of application No. 15/835,436, filed on Dec. 7, 2017, now Pat. No. 10,572,828, which is a continuation-in-part of (Continued)

(51) Int. Cl.
| | |
|---|---|
| *G06F 9/455* | (2018.01) |
| *G06F 8/30* | (2018.01) |
| *G06F 8/41* | (2018.01) |
| *G06F 30/27* | (2020.01) |
| *H04L 41/0813* | (2022.01) |
| *G06Q 10/067* | (2023.01) |

(52) U.S. Cl.
CPC ............. *G06F 9/455* (2013.01); *G06F 8/30* (2013.01); *G06F 8/41* (2013.01); *G06F 30/27* (2020.01); *H04L 41/0813* (2013.01); *G06Q 10/067* (2013.01)

(58) Field of Classification Search
CPC . G06F 9/455; G06F 30/27; G06F 8/30; G06F 8/41; H04L 41/0813
See application file for complete search history.

(56) References Cited

U.S. PATENT DOCUMENTS

| 5,669,000 A | 9/1997 | Jessen et al. |
| 6,256,544 B1 | 7/2001 | Weissinger |

(Continued)

FOREIGN PATENT DOCUMENTS

| CN | 105302532 B | 6/2018 |
| WO | 2014159150 A1 | 10/2014 |
| WO | 2017075543 A1 | 5/2017 |

*Primary Examiner* — Chuen-Meei Gan
(74) *Attorney, Agent, or Firm* — Galvin Patent Law LLC; Brian R. Galvin

(57) ABSTRACT

A system and method for generating and applying meta-models in simulated environments, in which an agent simulation is selected, one or more agent goals are received, and agents are created which are individual instances of the agent simulation with each agent having at least one of the agent goals, wherein the agents are used in the execution of an environment simulation which dynamically changes based on the collective behavior of the agents. The agents operate in the environment simulation using meta-models which describe how the agents interact with other agent and how the agents interact within the simulation.

4 Claims, 14 Drawing Sheets

Related U.S. Application Data application No. 15/790,457, filed on Oct. 23, 2017, now Pat. No. 10,884,999, which is a continuation-in-part of application No. 15/790,327, filed on Oct. 23, 2017, now Pat. No. 10,860,951, and a continuation-in-part of application No. 15/616,427, filed on Jun. 7, 2017, now abandoned, which is a continuation-in-part of application No. 14/925,974, filed on Oct. 28, 2015, now abandoned, said application No. 15/790,327 is a continuation-in-part of application No. 15/141,752, filed on Apr. 28, 2016, now Pat. No. 10,860,962, which is a continuation-in-part of application No. 15/091,563, filed on Apr. 5, 2016, now Pat. No. 10,204,147, and a continuation-in-part of application No. 14/986,536, filed on Dec. 31, 2015, now Pat. No. 10,210,255, and a continuation-in-part of application No. 14/925,974, filed on Oct. 28, 2015, now abandoned, said application No. 15/882,180 is a continuation-in-part of application No. 15/835,312, filed on Dec. 7, 2017, now Pat. No. 11,055,451, which is a continuation-in-part of application No. 15/186,453, filed on Jun. 18, 2016, now abandoned, which is a continuation-in-part of application No. 15/166,158, filed on May 26, 2016, now abandoned, which is a continuation-in-part of application No. 15/141,752, filed on Apr. 28, 2016, now Pat. No. 10,860,962.

(60) Provisional application No. 62/568,291, filed on Oct. 4, 2017, provisional application No. 62/568,298, filed on Oct. 4, 2017.

(56) References Cited

U.S. PATENT DOCUMENTS

| | | | |
|---|---|---|---|
| 6,477,572 B1 | 11/2002 | Elderton et al. | |
| 7,072,863 B1 | 7/2006 | Phillips et al. | |
| 7,657,406 B2 | 2/2010 | Tolone et al. | |
| 7,698,213 B2 | 4/2010 | Lancaster | |
| 7,739,653 B2 | 6/2010 | Venolia | |
| 8,065,257 B2 | 11/2011 | Kuecuekyan | |
| 8,145,761 B2 | 3/2012 | Liu et al. | |
| 8,281,121 B2 | 10/2012 | Nath et al. | |
| 8,615,800 B2 | 12/2013 | Baddour et al. | |
| 8,788,306 B2 | 7/2014 | Delurgio et al. | |
| 8,793,758 B2 | 7/2014 | Raleigh et al. | |
| 8,914,878 B2 | 12/2014 | Burns et al. | |
| 8,997,233 B2 | 3/2015 | Green et al. | |
| 9,134,966 B2 | 9/2015 | Brock et al. | |
| 9,141,360 B1 | 9/2015 | Chen et al. | |
| 9,231,962 B1 | 1/2016 | Yen et al. | |
| 9,602,530 B2 | 3/2017 | Ellis et al. | |
| 9,654,495 B2 | 5/2017 | Hubbard et al. | |
| 9,672,355 B2 | 6/2017 | Titonis et al. | |
| 9,686,308 B1 | 6/2017 | Srivastava | |
| 9,762,443 B2 | 9/2017 | Dickey | |
| 9,887,933 B2 | 2/2018 | Lawrence, III | |
| 9,946,517 B2 | 4/2018 | Talby et al. | |
| 10,061,635 B2 | 8/2018 | Ellwein | |
| 10,102,480 B2 | 10/2018 | Dirac et al. | |
| 10,210,246 B2 | 2/2019 | Stojanovic et al. | |
| 10,210,255 B2 | 2/2019 | Crabtree et al. | |
| 10,242,406 B2 | 3/2019 | Kumar et al. | |
| 10,248,910 B2 | 4/2019 | Crabtree et al. | |
| 10,318,882 B2 | 6/2019 | Brueckner et al. | |
| 10,367,829 B2 | 7/2019 | Huang et al. | |
| 10,511,498 B1 | 12/2019 | Narayan et al. | |
| 2003/0041254 A1 | 2/2003 | Challener et al. | |
| 2003/0145225 A1 | 7/2003 | Bruton et al. | |
| 2005/0289072 A1 | 12/2005 | Sabharwal | |
| 2006/0149575 A1 | 7/2006 | Varadarajan et al. | |
| 2007/0150744 A1 | 6/2007 | Cheng et al. | |
| 2009/0064088 A1 | 3/2009 | Barcia et al. | |
| 2009/0089227 A1 | 4/2009 | Sturrock et al. | |
| 2009/0182672 A1 | 7/2009 | Doyle | |
| 2009/0222562 A1 | 9/2009 | Liu et al. | |
| 2009/0293128 A1 | 11/2009 | Lippmann et al. | |
| 2011/0060821 A1 | 3/2011 | Loizeaux et al. | |
| 2011/0087888 A1 | 4/2011 | Rennie | |
| 2011/0154341 A1 | 6/2011 | Pueyo et al. | |
| 2012/0266244 A1 | 10/2012 | Green et al. | |
| 2013/0073062 A1 | 3/2013 | Smith et al. | |
| 2013/0132149 A1 | 5/2013 | Wei et al. | |
| 2013/0191416 A1 | 7/2013 | Lee et al. | |
| 2013/0246996 A1 | 9/2013 | Duggal et al. | |
| 2013/0304623 A1 | 11/2013 | Kumar et al. | |
| 2014/0156806 A1 | 6/2014 | Karpistsenko et al. | |
| 2014/0244612 A1 | 8/2014 | Bhasin et al. | |
| 2014/0279762 A1 | 9/2014 | Xaypanya et al. | |
| 2015/0149979 A1 | 5/2015 | Talby et al. | |
| 2015/0163242 A1 | 6/2015 | Laidlaw et al. | |
| 2015/0169294 A1 | 6/2015 | Brock et al. | |
| 2015/0195192 A1 | 7/2015 | Vasseur et al. | |
| 2015/0236935 A1 | 8/2015 | Bassett | |
| 2015/0281225 A1 | 10/2015 | Schoen et al. | |
| 2015/0317481 A1 | 11/2015 | Gardner et al. | |
| 2015/0339263 A1 | 11/2015 | Ata et al. | |
| 2015/0347414 A1 | 12/2015 | Xiao et al. | |
| 2015/0379424 A1 | 12/2015 | Dirac et al. | |
| 2016/0004858 A1 | 1/2016 | Chen et al. | |
| 2016/0028758 A1 | 1/2016 | Ellis et al. | |
| 2016/0072845 A1 | 3/2016 | Chiviendacz et al. | |
| 2016/0078361 A1 | 3/2016 | Brueckner et al. | |
| 2016/0099960 A1 | 4/2016 | Gerritz et al. | |
| 2016/0105454 A1 | 4/2016 | Li et al. | |
| 2016/0140519 A1 | 5/2016 | Trepca et al. | |
| 2016/0180240 A1* | 6/2016 | Majumdar | G06N 3/006 706/46 |
| 2016/0275123 A1 | 9/2016 | Lin et al. | |
| 2016/0285732 A1 | 9/2016 | Brech et al. | |
| 2016/0342606 A1 | 11/2016 | Mouel et al. | |
| 2016/0350442 A1 | 12/2016 | Crosby | |
| 2016/0364307 A1 | 12/2016 | Garg et al. | |
| 2017/0019678 A1 | 1/2017 | Kim et al. | |
| 2017/0063896 A1 | 3/2017 | Muddu et al. | |
| 2017/0083380 A1 | 3/2017 | Bishop et al. | |
| 2017/0126712 A1 | 5/2017 | Crabtree et al. | |
| 2017/0139763 A1 | 5/2017 | Ellwein | |
| 2017/0149802 A1 | 5/2017 | Huang et al. | |
| 2017/0193110 A1 | 7/2017 | Crabtree et al. | |
| 2017/0206360 A1 | 7/2017 | Brucker et al. | |
| 2017/0322959 A1 | 11/2017 | Tidwell et al. | |
| 2017/0323089 A1 | 11/2017 | Duggal et al. | |
| 2018/0197128 A1 | 7/2018 | Carstens et al. | |
| 2018/0300930 A1 | 10/2018 | Kennedy et al. | |
| 2019/0082305 A1 | 3/2019 | Proctor | |
| 2019/0095533 A1 | 3/2019 | Levine et al. | |
| 2019/0171438 A1* | 6/2019 | Franchitti | G06N 3/08 |

\* cited by examiner

SYSTEM AND METHODS FOR CREATION AND USE OF META-MODELS IN SIMULATED ENVIRONMENTS

CROSS-REFERENCE TO RELATED APPLICATIONS

Priority is claimed in the application data sheet to the following patents or patent applications, the entire written description of each of which is expressly incorporated herein by reference in its entirety.
Ser. No. 15/882,180
Ser. No. 15/835,436
Ser. No. 15/790,457
Ser. No. 15/790,327
62/568,291
Ser. No. 15/616,427
Ser. No. 14/925,974
Ser. No. 15/141,752
Ser. No. 15/091,563
Ser. No. 14/986,536
Ser. No. 14/925,974
62/568,298
Ser. No. 15/835,312
Ser. No. 15/186,453
Ser. No. 15/166,158
Ser. No. 15/141,752

BACKGROUND OF THE INVENTION

Field of the Art

The disclosure relates to the field of digital simulations, more specifically to the field of simulated actors or agents with machine learning in simulated environments.

Discussion of the State of the Art

Currently, it is possible for computers and servers to run rigid, unchanging, OS-specific and language-specifics simulation environments with pre-set agents or actors in them, to achieve a variety of results. There are issues with the current state of simulation engines and with the generation of actors or agents in those engines, however. Currently, it is impossible to generate agents (which will be used interchangeably with "actors" for the rest of this disclosure) which are capable of machine learning techniques inside of simulated environments, most especially simulated environments which are generated procedurally or stochastically and not hard-coded environments which are un-changing from one runtime to the next. Agents in simulated environments operate on hard-coded and static behaviors which are un-changing for the most part, and are not extremely useful to a variety of simulated environments which may elucidate real-world situations or environments with machine learning.

What is needed is a system and methods for creation and execution of meta-models in simulated environments, so that simulated environments may be executed with agents operating in the environment using meta-models that are capable of learning and evolving their behavior, to simulate a number of real-world situations such as economic environments or biological systems.

SUMMARY OF THE INVENTION

Accordingly, the inventor has conceived and reduced to practice, a system and method for generating and applying meta-models in simulated environments, in which an agent simulation is selected, one or more agent goals are received, and agents are created which are individual instances of the agent simulation with each agent having at least one of the agent goals, wherein the agents are used in the execution of an environment simulation which dynamically changes based on the collective behavior of the agents. The agents operate in the environment simulation using meta-models which describe how the agents interact with other agent and how the agents interact within the simulation.

According to a first preferred embodiment, a system for generating meta-models in simulated environments is disclosed, comprising: a computing device comprising a memory and a processor; a meta-model module comprising a first plurality of programming instructions stored in the memory and operating on the processor, wherein the first plurality of programming instructions, when operating on the processor, cause the computing device to: obtain one or more models of an agent; generate source code of the one or more models; compile the source code to provide compiled code; and reconfigure two or more compiled codes from at least two agents to provide a meta-model relating to the possible interactions between the at least two agents; and at least one simulation manager comprising a second plurality of programming instructions stored in the memory and operating on the processor, wherein the second plurality of programming instructions, when operating on the processor, cause the computing device to: receive a simulation goal related to one or more agent goals; select a dynamic environment simulation based on the simulation goal; execute the dynamic environment simulation using a plurality of meta-models; and continue the execution of the dynamic environment simulation that evolves with agent behavior from the execution of the plurality of agents and the plurality of meta-models until the simulation goal has been reached or until each agent has achieved its agent goal from the one or more agent goals.

According to a second preferred embodiment, a method for generating meta-models in simulated environments is disclosed, comprising: obtaining one or more models of an agent; generating source code of the one or more models; compiling the source code to provide compiled code; reconfiguring two or more compiled codes from at least two agents to provide a meta-model relating to the possible interactions between the at least two agents; receiving a simulation goal related to one or more agent goals; selecting a dynamic environment simulation based on the simulation goal; executing the dynamic environment simulation using a plurality of meta-models; and continuing the execution of the dynamic environment simulation that evolves with agent behavior from the execution of the plurality of agents and the plurality of meta-models until the simulation goal has been reached or until each agent has achieved its agent goal from the one or more agent goals.

According to various aspects, wherein the agent creation engine operates on a simulation execution server and wherein the agent creation engine operates on a separate server from the simulation execution server.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exem- FIG. 1 is a diagram of an exemplary architecture of a business operating system according to a preferred aspect.

DETAILED DESCRIPTION

Figure 1:
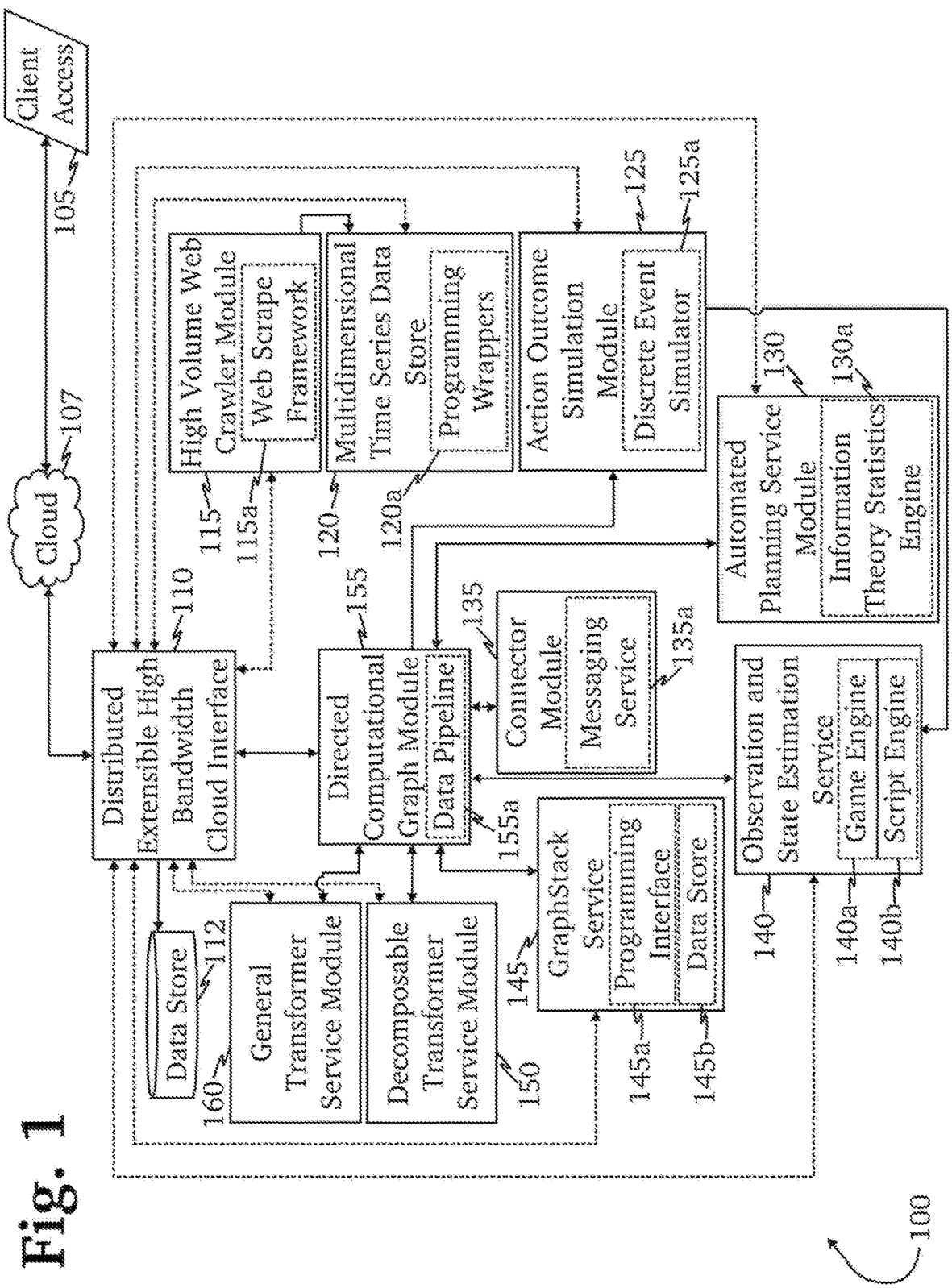

The inventor has conceived, and reduced to practice, a system and method for generating and applying meta-models in simulated environments, in which an agent simulation is selected, one or more agent goals are received, and agents are created which are individual instances of the agent simulation with each agent having at least one of the agent goals, wherein the agents are used in the execution of an environment simulation which dynamically changes based on the collective behavior of the agents. The agents operate in the environment simulation using meta-models which describe how the agents interact with other agent and how the agents interact within the simulation.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

As used herein, a "meta-model," "meta model" or "meta-model" is a data structure representing relationships between simulation models and simulated environments using those models, as well as external or locally based computer tools which can be used for computational purposes. A meta-model is able to allow simulated environments which use a given meta-model to use specific models for simulation which normally possess strict limitations and functions, but use other simulation modeling engines such as different physics engines, without changing the content or function of any simulation model or the engine running it. For example, a single meta-model might record a relationship between two physics engines, one being a generic physics engine with components such as rag-doll physics, jump speed for characters in a video game, bullet physics, and destructible environment physics, and the other physics engine being solely flight simulation. In such an example, the meta-model may specify that the flight simulation engine's physics may be applied to objects that, in the generic physics engine, are recorded as "plane" objects, thereby bypassing the need to alter either engine, and allowing both to work as-is, with each other, through the use of specified relationships in the meta-model.

Conceptual Architecture

FIG. 1 is a diagram of an exemplary architecture of a business operating system 100 according to an embodiment of the invention. Client access to the system 105 for specific data entry, system control and for interaction with system output such as automated predictive decision making and planning and alternate pathway simulations, occurs through the system's distributed, extensible high bandwidth cloud interface 110, connected to the wider cloud 107 through use of a network including Internet Protocol (IP) networks, which uses a versatile, robust web application driven interface for both input and display of client-facing information and a data store 112 such as, but not limited to MONGODB™, COUCHDB™, CASSANDRA™ or REDIS™ depending on the embodiment. Much of the business data analyzed by the system both from sources within the confines of the client business, and from cloud based sources, also enter the system through the cloud interface 110, data being passed to the connector module 135 which may possess the API routines 135a needed to accept and convert the external data and then pass the normalized information to other analysis and transformation components of the system, the directed computational graph module 155, high volume web crawler module 115, multidimensional time series database 120 with API's or other programming wrappers 120a and the graph stack service. The directed computational graph module 155 retrieves one or more streams of data from a plurality of sources, which includes, but is in no way not limited to, a plurality of physical sensors, web based questionnaires and surveys, monitoring of electronic infrastructure, crowd sourcing campaigns, and human input device information. Within the directed computational graph module 155, data may be split into two identical streams in a specialized pre-programmed data pipeline 155a, wherein one sub-stream may be sent for batch processing and storage while the other sub-stream may be reformatted for transformation pipeline analysis. The data is then transferred to the general transformer service module 160 for linear data transformation as part of analysis or the decomposable transformer service module 150 for branching or iterative transformations that are part of analysis. The directed computational graph module 155 represents all data as directed graphs where the transformations are nodes and the result messages between transformations edges of the graph. The high volume web crawling module 115 uses multiple server hosted preprogrammed web spiders, which while autonomously configured are deployed within a web scraping framework 115a of which SCRAPY™ is an example, to identify and retrieve data of interest from web based sources that are not well tagged by conventional web crawling technology. The multiple dimension time series database module 120 receives data from a large plurality of sensors that may be of several different types. The module is designed to accommodate irregular and high volume surges by dynamically allotting network bandwidth and server processing channels to process the incoming data. Inclusion of programming wrappers for languages examples of which are, but not limited to C++, PERL, PYTHON, and ERLANG™ allows sophisticated programming logic to be added to the default function of the multidimensional time series database 120 without intimate knowledge of the core programming as a wrapper or add-on 120a, greatly extending breadth of function. Data retrieved by the multidimensional time series database 120 and the high volume web crawling module 115 may be further analyzed and transformed into task optimized results by the directed computational graph 155 and associated general transformer service 150 and decomposable transformer service 160 modules. Alternately, data from the multidimensional time series database and high volume web crawling modules may be sent, often with scripted cuing information determining important vertexes 145a, to the graph stack service module 145 which, employing standardized protocols for converting streams of information into graph representations of that data, for example, open graph internet technology although the invention is not reliant on any one standard. Through the steps, the graph stack service module 145 represents data in graphical form influenced by any predetermined scripted modifications 145a and stores it in a graph-based data store 145b such as GIRAPH™ or a key value pair type data store REDIS™, or RIAK™, among others, all of which are suitable for storing graph-based information.

Results of the transformative analysis process may then be combined with further client directives, additional business rules and practices relevant to the analysis and situational information external to the already available data in the automated planning service module 130 which also runs powerful information theory 130a based predictive statistics functions and machine learning algorithms to allow future trends and outcomes to be rapidly forecast based upon the current system derived results and choosing each of a plurality of possible business decisions. The using all available data, the automated planning service module 130 may propose business decisions most likely to result is the most favorable business outcome with a usably high level of certainty. Closely related to the automated planning service module in the use of system derived results in conjunction with possible externally supplied additional information in the assistance of end user business decision making, the action outcome simulation module 125 with its discrete event simulator programming module 125a coupled with the end user facing observation and state estimation service 140 which is highly scriptable 140b as circumstances require and has a game engine 140a to more realistically stage possible outcomes of business decisions under consideration, allows business decision makers to investigate the probable outcomes of choosing one pending course of action over another based upon analysis of the current available data. For example, the pipelines operations department has reported a very small reduction in crude oil pressure in a section of pipeline in a highly remote section of territory. Many believe the issue is entirely due to a fouled, possibly failing flow sensor, others believe that it is a proximal upstream pump that may have foreign material stuck in it. Correction of both of these possibilities is to increase the output of the effected pump to hopefully clean out it or the fouled sensor. A failing sensor will have to be replaced at the next maintenance cycle. A few, however, feel that the pressure drop is due to a break in the pipeline, probably small at this point, but even so, crude oil is leaking and the remedy for the fouled sensor or pump option could make the leak much worse and waste much time afterwards. The company does have a contractor about 8 hours away, or could rent satellite time to look but both of those are expensive for a probable sensor issue, significantly less than cleaning up an oil spill though and then with significant negative public exposure. These sensor issues have happened before and the business operating system 100 has data from them, which no one really studied due to the great volume of columnar figures, so the alternative courses 125, 140 of action are run. The system, based on all available data, predicts that the fouled sensor or pump is unlikely to be the root cause this time due to other available data, and the contractor is dispatched. She finds a small breach in the pipeline. There will be a small cleanup and the pipeline needs to be shut down for repair but multiple tens of millions of dollars have been saved. This is just one example of a great many of the possible use of the business operating system, those knowledgeable in the art will easily formulate more.

Figure 2:
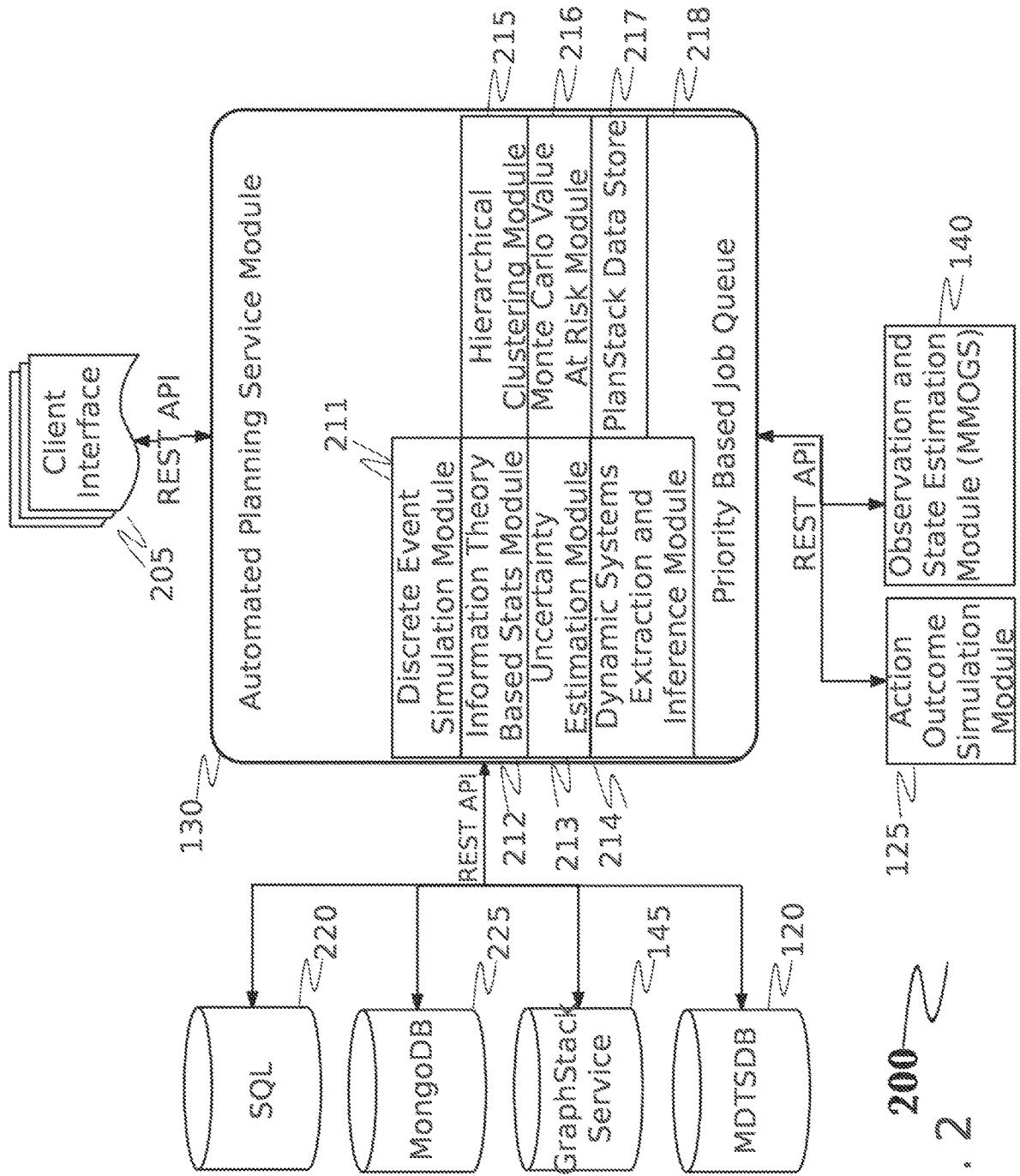
FIG. 2 is a diagram of an exemplary architecture of an automated planning service cluster and related modules according to a preferred aspect.

FIG. 2 is a diagram of an exemplary architecture of an automated planning service module and related modules 200 according to an embodiment of the invention. Seen here is a more detailed view of the automated planning service module 130 as depicted in FIG. 1. The module functions by receiving business decision or business venture candidates as well as relevant currently available related data and any campaign analysis modification commands through a client interface 205. The module may also be used provide transformed data or run parameters to the action outcome simulation module 125 to seed a simulation prior to run or to transform intermediate result data isolated from one or more actors operating in the action outcome simulation module 125, during a simulation run. Significant amounts of supporting information such as, but not restricted to current business conditions, infrastructure, ongoing venture status, financial status, market conditions, and world events which may impact the current decision or venture that have been collected by the business operating system as a whole and stored in such data stores as the multidimensional times series database 120, the analysis capabilities of the directed computational graph module 155 and web-based data retrieval abilities of the high volume web crawler module 115 all of which may be stored in one or more data stores 220, 225 may also be used during simulation of alternative business decision progression, which may entail such variables as, but are not limited to implementation timing, method to end changes, order and timing of constituent part completion or impact of choosing another goal instead of an action currently under analysis.

Contemplated actions may be broken up into a plurality of constituent events that either act towards the fulfillment of the venture under analysis or represent the absence of each event by the discrete event simulation module 211 which then makes each of those events available for information theory based statistical analysis 212, which allows the current decision events to be analyzed in light of similar events under conditions of varying dis-similarity using machine learned criteria obtained from that previous data; results of this analysis in addition to other factors may be analyzed by an uncertainty estimation module 213 to further tune the level of confidence to be included with the finished analysis. Confidence level would be a weighted calculation of the random variable distribution given to each event analyzed. Prediction of the effects of at least a portion of the events involved with a business venture under analysis within a system as complex as anything from the microenvironment in which the client business operates to more expansive arenas as the regional economy or further, from the perspective of success of the client business is calculated in dynamic systems extraction and inference module 214, which use, among other tools algorithms based upon Shannon entropy, Hartley entropy and mutual information dependence theory.

Of great importance in any business decision or new business venture is the amount of business value that is being placed at risk by choosing one decision over another. Often this value is monetary but it can also be competitive placement, operational efficiency or customer relationship based, for example: the may be the effects of keeping an older, possibly somewhat malfunctioning customer relationship management system one more quarter instead of replacing it for $14 million dollars and a subscription fee. The automated planning service module has the ability predict the outcome of such decisions per value that will be placed at risk using programming based upon the Monte Carlo heuristic model 216 which allows a single "state" estimation of value at risk. It is very difficult to anticipate the amount of computing power that will be needed to complete one or more of these business decision analyses which can vary greatly in individual needs and often are run with several alternatives concurrently. The invention is therefore designed to run on expandable clusters 215, in a distributed, modular, and extensible approach, such as, but not exclusively, offerings of Amazon's AWS. Similarly, these analysis jobs may run for many hours to completion and many clients may be anticipating long waits for simple "what if" options which will not affect their business operations in the near term while other clients may have come upon a pressing decision situation where they need alternatives as soon as possible. This is accommodated by the presence of a job queue that allows analysis jobs to be implemented at one of multiple priority levels from low to urgent. In case of a change in more hypothetical analysis jobs to more pressing, job priorities can also be changed during run without loss of progress using the priority based job queue 218.

Structured plan analysis result data may be stored in either a general purpose automated planning engine executing Action Notation Modeling Language (ANML) scripts for modeling which can be used to prioritize both human and machine-oriented tasks to maximize reward functions over finite time horizons 217 or through the graph-based data store 145, depending on the specifics of the analysis in complexity and time run.

The results of analyses may be sent to one of two client facing presentation modules, the action outcome simulation module 125 or the more visual simulation capable observation and state estimation module 140 depending on the needs and intended usage of the data by the client.

Figure 3:
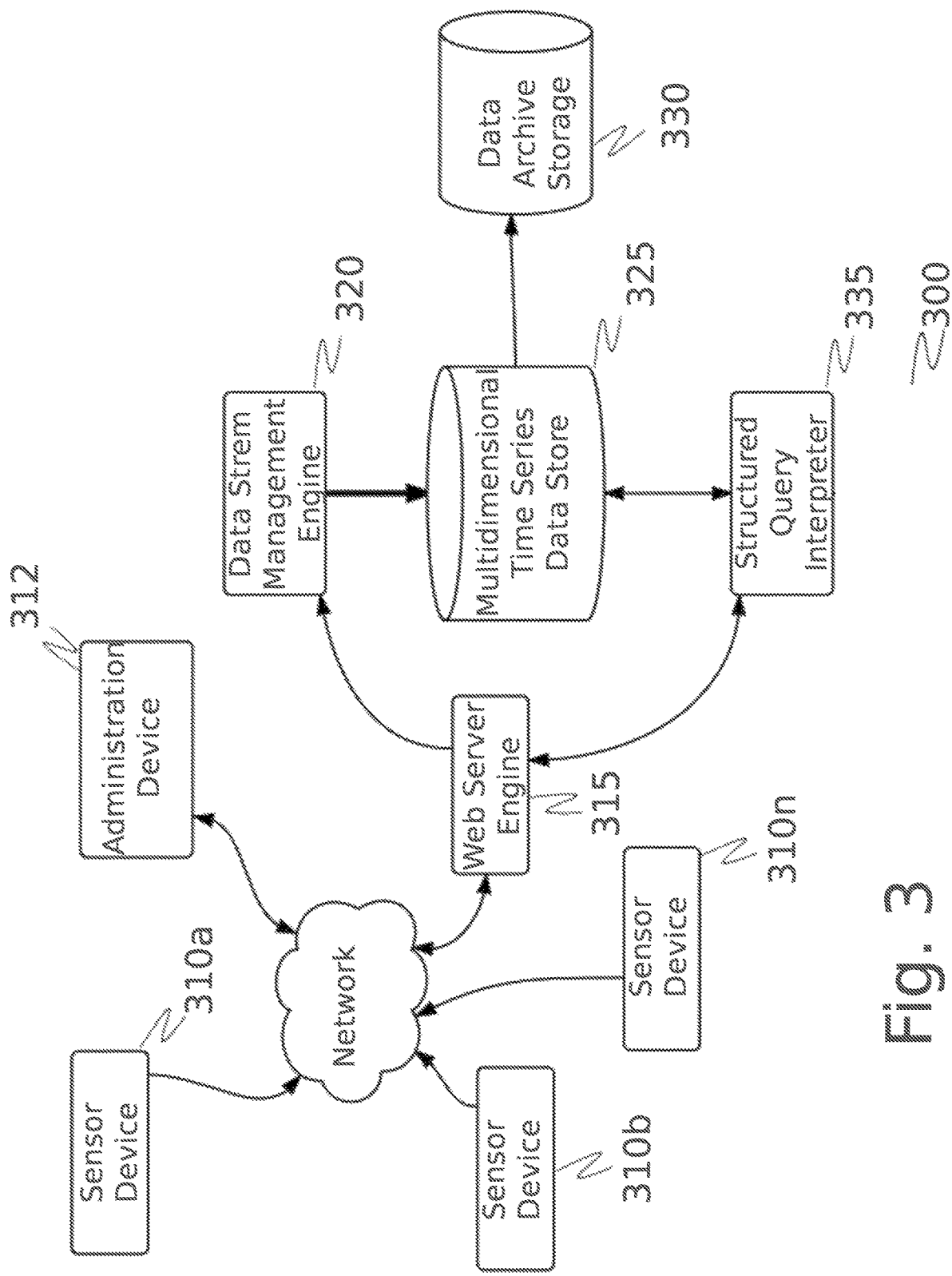
FIG. 3 is a diagram of an exemplary architecture of a system for the capture and storage of time series data from sensors with heterogeneous reporting profiles according to an embodiment of the invention.

FIG. 3 is a diagram of an exemplary architecture of a system for the capture and storage of time series data from sensors with heterogeneous reporting profiles according to an embodiment of the invention 300. In this embodiment, a plurality of sensor devices 310*a-n* stream data to a collection device, in this case a web server acting as a network gateway 315. These sensors 310*a-n* can be of several forms, some non-exhaustive examples being: physical sensors measuring humidity, pressure, temperature, orientation, and presence of a gas; or virtual such as programming measuring a level of network traffic, memory usage in a controller, and number of times the word "refill" is used in a stream of email messages on a particular network segment, to name a small few of the many diverse forms known to the art. In the embodiment, the sensor data is passed without transformation to the data management engine 320, where it is aggregated and organized for storage in a specific type of data store 325 designed to handle the multidimensional time series data resultant from sensor data. Raw sensor data can exhibit highly different delivery characteristics. Some sensor sets may deliver low to moderate volumes of data continuously. It would be infeasible to attempt to store the data in this continuous fashion to a data store as attempting to assign identifying keys and then to store real time data from multiple sensors would invariably lead to significant data loss. In this circumstance, the data stream management engine 320 would hold incoming data in memory, keeping only the parameters, or "dimensions" from within the larger sensor stream that are pre-decided by the administrator of the study as important and instructions to store them transmitted from the administration device 312. The data stream management engine 320 would then aggregate the data from multiple individual sensors and apportion that data at a predetermined interval, for example, every 10 seconds, using the timestamp as the key when storing the data to a multidimensional time series data store over a single swimlane of sufficient size. This highly ordered delivery of a foreseeable amount of data per unit time is particularly amenable to data capture and storage but patterns where delivery of data from sensors occurs irregularly and the amount of data is extremely heterogeneous are quite prevalent. In these situations, the data stream management engine cannot successfully use strictly single time interval over a single swimlane mode of data storage. In addition to the single time interval method the invention also can make use of event based storage triggers where a predetermined number of data receipt events, as set at the administration device 312, triggers transfer of a data block consisting of the apportioned number of events as one dimension and a number of sensor ids as the other. In the embodiment, the system time at commitment or a time stamp that is part of the sensor data received is used as the key for the data block value of the value-key pair. The invention can also accept a raw data stream with commitment occurring when the accumulated stream data reaches a predesigned size set at the administration device 312.

It is also likely that during times of heavy reporting from a moderate to large array of sensors, the instantaneous load of data to be committed will exceed what can be reliably transferred over a single swimlane. The embodiment of the invention can, if capture parameters pre-set at the administration device 312, combine the data movement capacity of two or more swimlanes, the combined bandwidth dubbed a metaswimlane, transparently to the committing process, to accommodate the influx of data in need of commitment. All sensor data, regardless of delivery circumstances are stored in a multidimensional time series data store 325 which is designed for very low overhead and rapid data storage and minimal maintenance needs to sap resources. The embodiment uses a key-value pair data store examples of which are Riak, Redis and Berkeley DB for their low overhead and speed, although the invention is not specifically tied to a single data store type to the exclusion of others known in the art should another data store with better response and feature characteristics emerge. Due to factors easily surmised by those knowledgeable in the art, data store commitment reliability is dependent on data store data size under the conditions intrinsic to time series sensor data analysis. The number of data records must be kept relatively low for the herein disclosed purpose. As an example one group of developers restrict the size of their multidimensional time series key-value pair data store to approximately $8.64 \times 10^4$ records, equivalent to 24 hours of 1 second interval sensor readings or 60 days of 1-minute interval readings. In this development system the oldest data is deleted from the data store and lost. This loss of data is acceptable under development conditions but in a production environment, the loss of the older data is almost always significant and unacceptable. The invention accounts for this need to retain older data by stipulating that aged data be placed in long term storage. In the embodiment, the archival storage is included 330. This archival storage might be locally provided by the user, might be cloud based such as that offered by Amazon Web Services or Google or could be any other available very large capacity storage method known to those skilled in the art.

Reliably capturing and storing sensor data as well as providing for longer term, offline, storage of the data, while important, is only an exercise without methods to repetitively retrieve and analyze most likely differing but specific sets of data over time. The invention provides for this requirement with a robust query language that both provides straightforward language to retrieve data sets bounded by multiple parameters, but to then invoke several transformations on that data set prior to output. In the embodiment isolation of desired data sets and transformations applied to that data occurs using pre-defined query commands issued from the administration device 312 and acted upon within the database by the structured query interpreter 335. Below is a highly simplified example statement to illustrate the method by which a very small number of options that are available using the structured query interpreter 335 might be accessed.

SELECT [STREAMING|EVENTS] data_spec FROM [unit] timestamp TO timestamp 15 GROUPBY (sensor_id, identifier) FILTER [filter_identifier] FORMAT [sensor [AS identifier] [, sensor [AS identifier]] . . . ] (TEXT|JSON-|FUNNEL|KML|GEOJSON|TOPOJSON);

Here "data_spec" might be replaced by a list of individual sensors from a larger array of sensors and each sensor in the list might be given a human readable identifier in the format "sensor AS identifier". "unit" allows the researcher to assign a periodicity for the sensor data such as second (s), minute (m), hour (h). One or more transformational filters, which include but a not limited to: mean, median, variance, standard deviation, standard linear interpolation, or Kalman filtering and smoothing, may be applied and then data formatted in one or more formats examples of with are text, JSON, KML, GEOJSON and TOPOJSON among others known to the art, depending on the intended use of the data.

Figure 4:
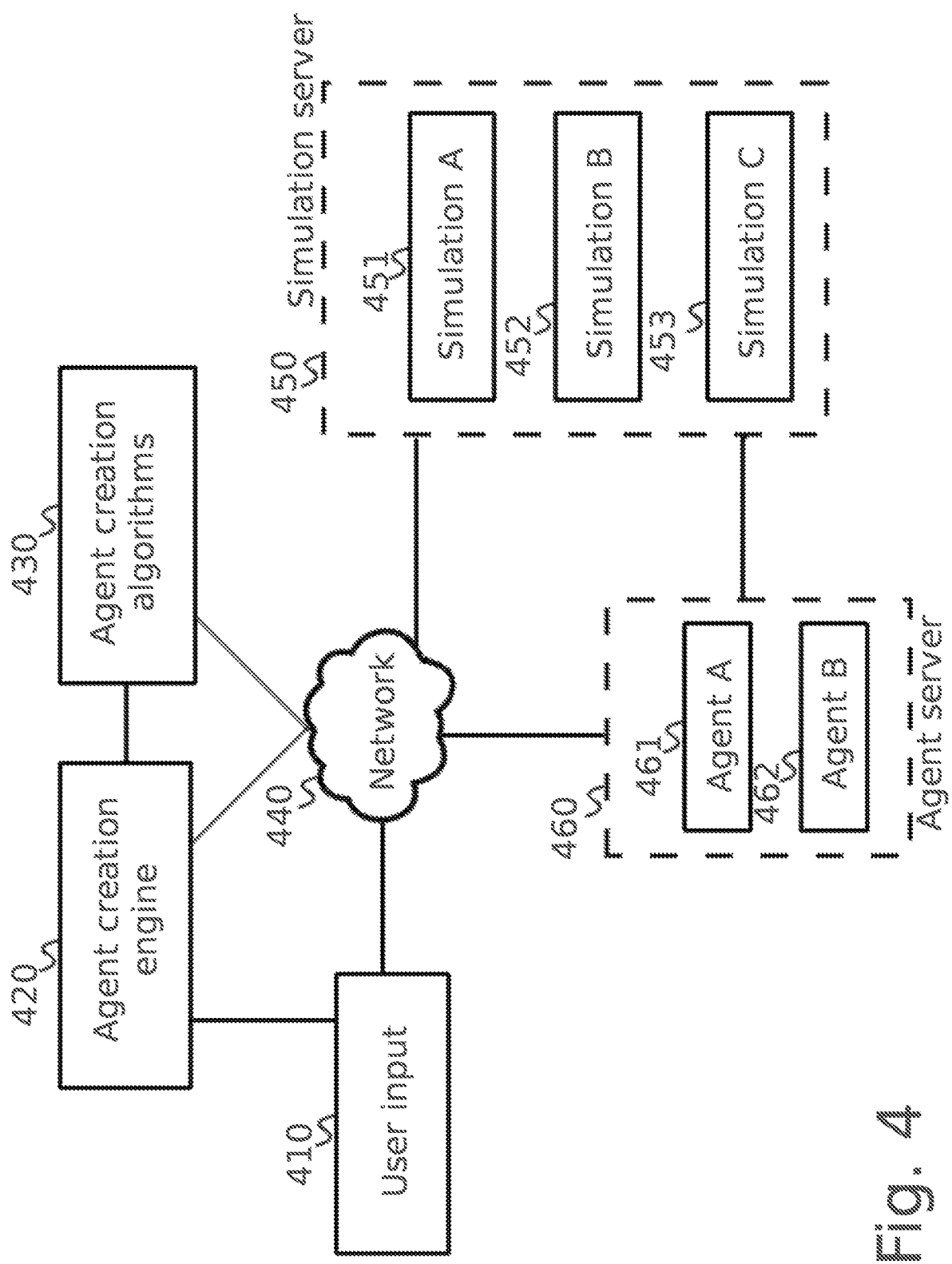
FIG. 4 is a diagram of an exemplary architecture of a system for agent creation for at least one simulated environment, but possibly several, across a network, according to a preferred aspect.

FIG. 4 is a system diagram illustrating connections between core components of the physical system necessary for agent creation, according to an aspect of the invention. An agent creation engine 420 may receive input from either a user 410 or specific algorithms and computer input 430, over a network 440 or all operating on the same computing device, in order to store desired parameters and settings for agents to be created. Algorithms and computer input 430 which may be used to specify parameters and attributes of agents may be based at least in part on simulated environments 450, for example a biological simulation may create new entities through reproduction, and agents created in the simulation in this manner may inherit some or all of their traits and parameters from their "parent" agents. Alternatively, the agent creation engine 420 may have settings in place to give all created agents certain default attributes, according to user specifications. The agent creation engine 420 may create agents in object text notation such as JSON, or may create them in database entries, or other preferred methods of storing data, according to an aspect. An indefinite number of agents 461, 462 may be created in this way by an agent creation engine 420 and may be stored on a server 460, over a network 440, which may be either the same server as those running simulated environments 450 or may be separate from the simulation engine server 450. In either implementation, an arbitrary number of simulations 451, 452, 453 running on a server 450 will communicate either over a network 440 with another server 460 to access agent templates and specifications as needed, or access such information on the same computer if such information is held on the same server as the one executing the simulation or simulations.

Figure 5:
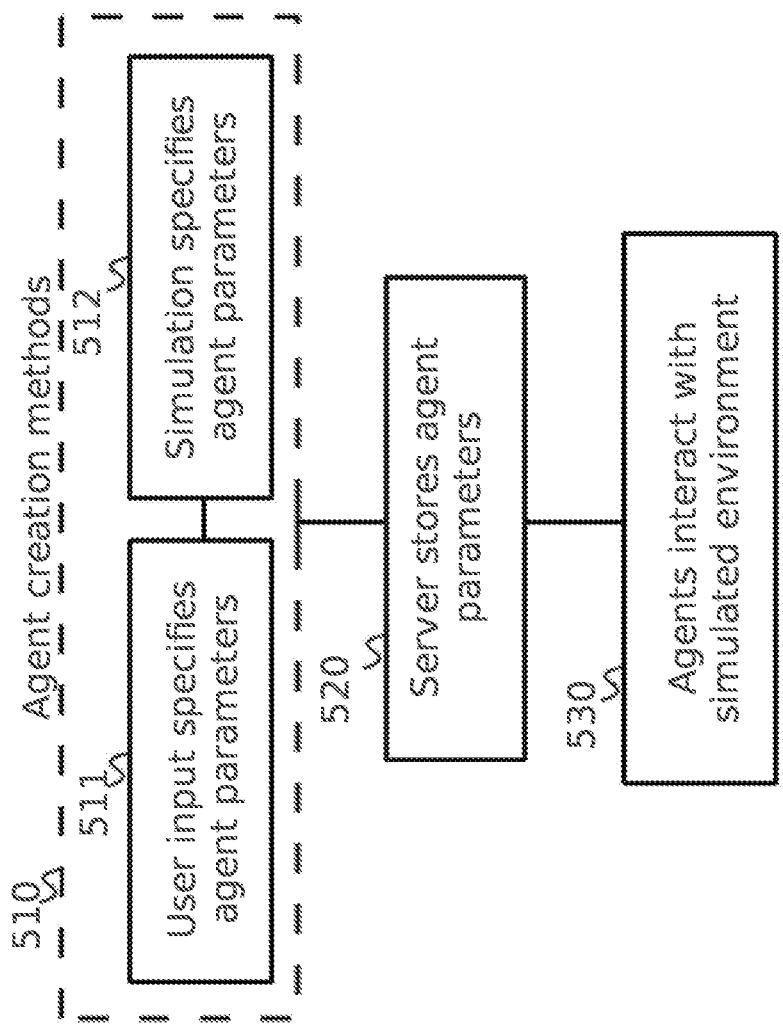
FIG. 5 is a method diagram illustrating agent creation for simulated environments, on a server, according to a preferred aspect.

FIG. 5 is a method diagram illustrating the basic steps in the process of an agent being created. Two primary methods of agent creation exist 510, one in which a user or external tool may specify some or all details of an agent's characteristics and parameters 511, and one in which a simulation may specify the attributes an agent must have 512. It is possible for a combination of pre-generated or inherited attributes 512 to be combined with user-specified attributes 511 for an agent's creation 510 for use in a simulated environment. Such attributes which may be specified programmatically or by a user with any variety of user interfaces may include things such as graphical representation of the agent in a simulation (for example, for use in a video game), reproductive capabilities (for example, in a simulation of a bacteria and surrounding environment), or other behaviors, attributes, or characteristics. These attributes or characteristics must then be stored on the server hosting the agent data 460, 520, using any format preferred at the time of execution, including NoSQL databases such as MONGODB™, SQL databases such as MYSQL™, raw or formatted text including JSON formatted text outside of databases, or other storage implementations. The agents specified and created in this manner may interact with a simulated environment 530, whether such a simulated environment is hosted on the same server 460 or a separate server 450 over a network 440. Interactions 530 in the simulated environment are dependent on what specifications the simulated environment and agents both possess. For example, it is possible with a hierarchical learning agent model to simulate a basic bacterium or similar single-celled organism, or a virus, in a petri dish or basic simulated living organism, which will be explored further in FIG. 7.

Figure 6:
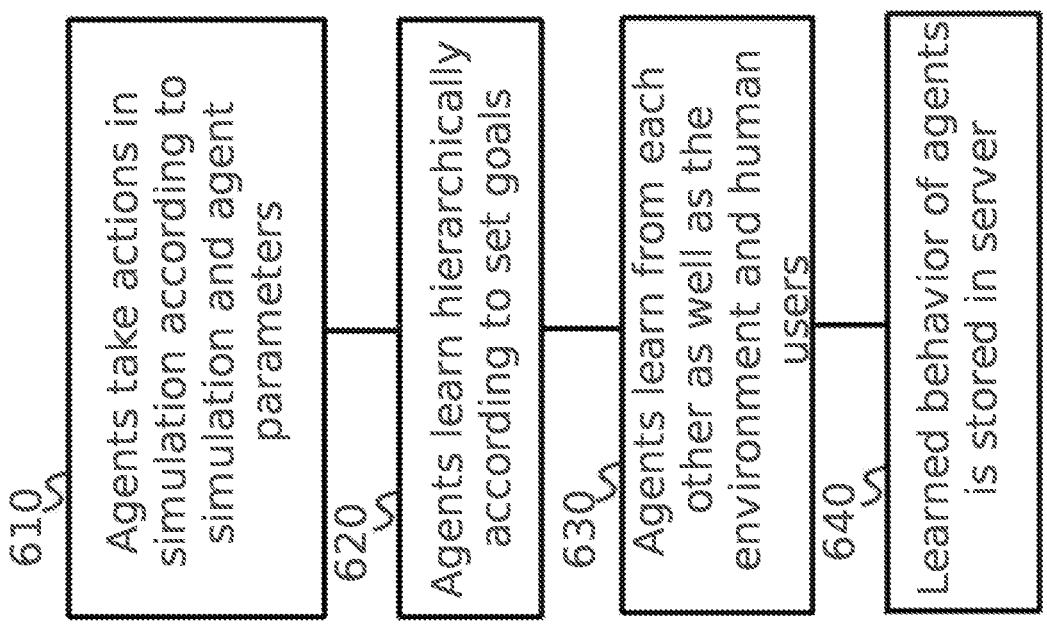
FIG. 6 is a method diagram illustrating agents acting in a simulated environment and utilizing machine learning to evolve their behavior in the simulated environment, according to a preferred aspect.

FIG. 6 is a method diagram illustrating several key steps agents created may take in interacting with, and learning from, environments they operate in. Agents may take many varied actions dependent on their specifications and the specifications of the simulated environment they are in 610, which may or may not be further dependent or influenced by a human user in the environment (for example agents may be left to operate in the environment for research purposes in simulating real-world environments, rather than needing human users to interact with them as in the case of a video game). A key component of agents created by the agent creation engine 420 is that they have some goal, whether defined in the simulated environment or defined in their own specifications and attributes, and work according to achieve this goal in a hierarchical fashion 620. For example, an agent being used to simulate a male human laborer in an economic simulation may have the end-goal of providing a living for a family represented by other simulated agents, and the simulated environment may fire the laborer in an effort to explain possible outcomes of job displacement for certain working groups. In such a hypothetical simulation, the hierarchical learning and acting of the agent in pursuit of a goal 620 may cause the agent to seek new work, which may require learning new skills, which may require lifestyle changes, which may require time and the spouse or partner of the agent to acquire a different job to pay bills in the meantime, and more. Many different actions and learned behaviors may be exhibited and acquired by individual agents, differentiating them from each other during a simulation execution, behaving in a non-deterministic environment such as stochastic game. In this way, agents may learn from each other 630, in an effort to build a knowledge base of how to achieve an outcome in a certain environment, or they may be programmed to not teach each other, and individual agent paths may be examined to examine the efficacy of each individual set of actions taken by each agent, according to what the purpose of the simulated environment is. Agents in a simulated environment may also learn from a human user in the simulate environment 630—for example, adaptive AI techniques in a strategy or tactical video game may result in agents learning patterns of behavior with the human user, and devising new methods of attack or defense in an effort to stump the player. In any such learning instance, regardless of the specific implementation, the result of the learned behavior is stored in a server 640 for semi-permanency, whether it is stored separately from the simulated environments along with the agent data 460 or whether such data is stored with the simulate environments on the same server 450, and regardless of which particular data storage implementation is chosen, including raw and formatted text, NoSQL databases, or SQL databases.

Figure 7:
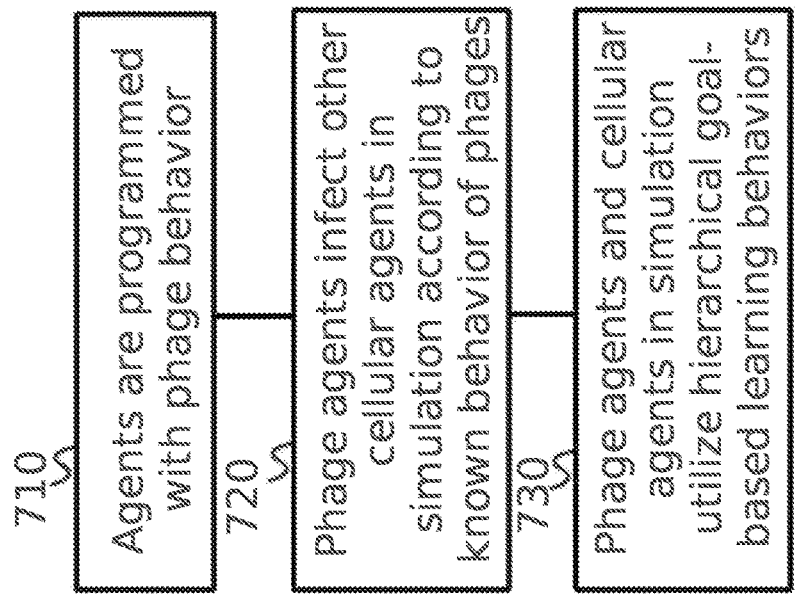
FIG. 7 is a method diagram illustrating agents in a simulated biological environment, according to a preferred aspect.

FIG. 7 is a method diagram illustrating a specific use-case for hierarchical learning agents in varied simulated environments, specifically the case of biological simulations. Agents in this use case may be created to simulate phages 710, for the goal of learning the behavior of bacteriophages and virophages (a new term in the medical field which may change usage in the future, by which is meant a virus which infects other viruses, often giant viruses, as a form of parasitic organism). Agents used to simulate these phages in behavior may then infect other cellular agents and viruses, according to how phages behave in the real world 720, with the mechanics of DNA replication and movement of many bacteria and viruses being fairly well-known and capable of being simulated. Utilizing hierarchical learning and possibly even group-behaviors, agents in this simulation may work to achieve basic goals such as "reproduce maximally" or other basic goals 730 which may elucidate the behavior and efficacy of using virophage therapy for patients, a new idea in medical research which requires research.

Figure 8:
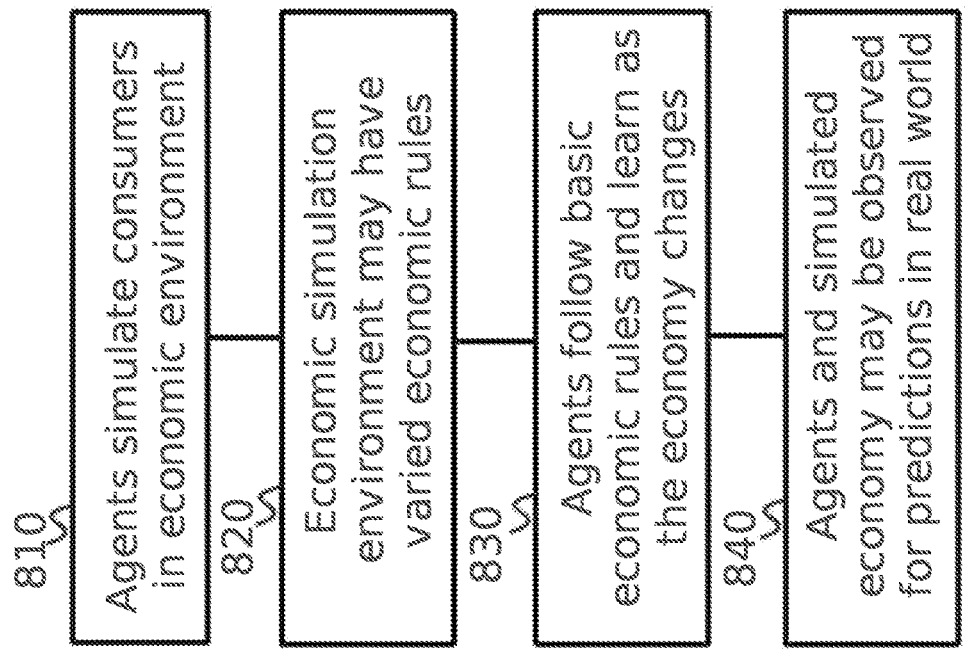
FIG. 8 is a method diagram illustrating agents acting in a simulated economic environment, according to a preferred aspect of the invention.

FIG. 8 is a method diagram illustrating a specific use-case for hierarchical learning agents in varied simulated environments, specifically the case of economic simulations. Agents in this case may simulate consumers and/or workers in an economic simulation 810, including purchasing of goods, using those goods up, replacing goods, working to produce goods or receive wages, and spending those wages, in an effort to map an economic environment to track purchases and laborers as the environment shifts, to monitor simulated learning behavior in a shifting economic landscape 830. The rules of the economy and the simulation itself may be diverse and detailed, or simplistic, depending on the desired research 820; using a stochastic method for the game, it is possible to run multiple simulations, with many agents, to find multiple different outcomes for each economy and each individual agent. In such economic simulations, agents and the results in the simulated environment's economy may be monitored for research purposes on analogues to a real-world economy 840, to isolate trends, find optimal behaviors in a given economic situation, and more.

Figure 9:
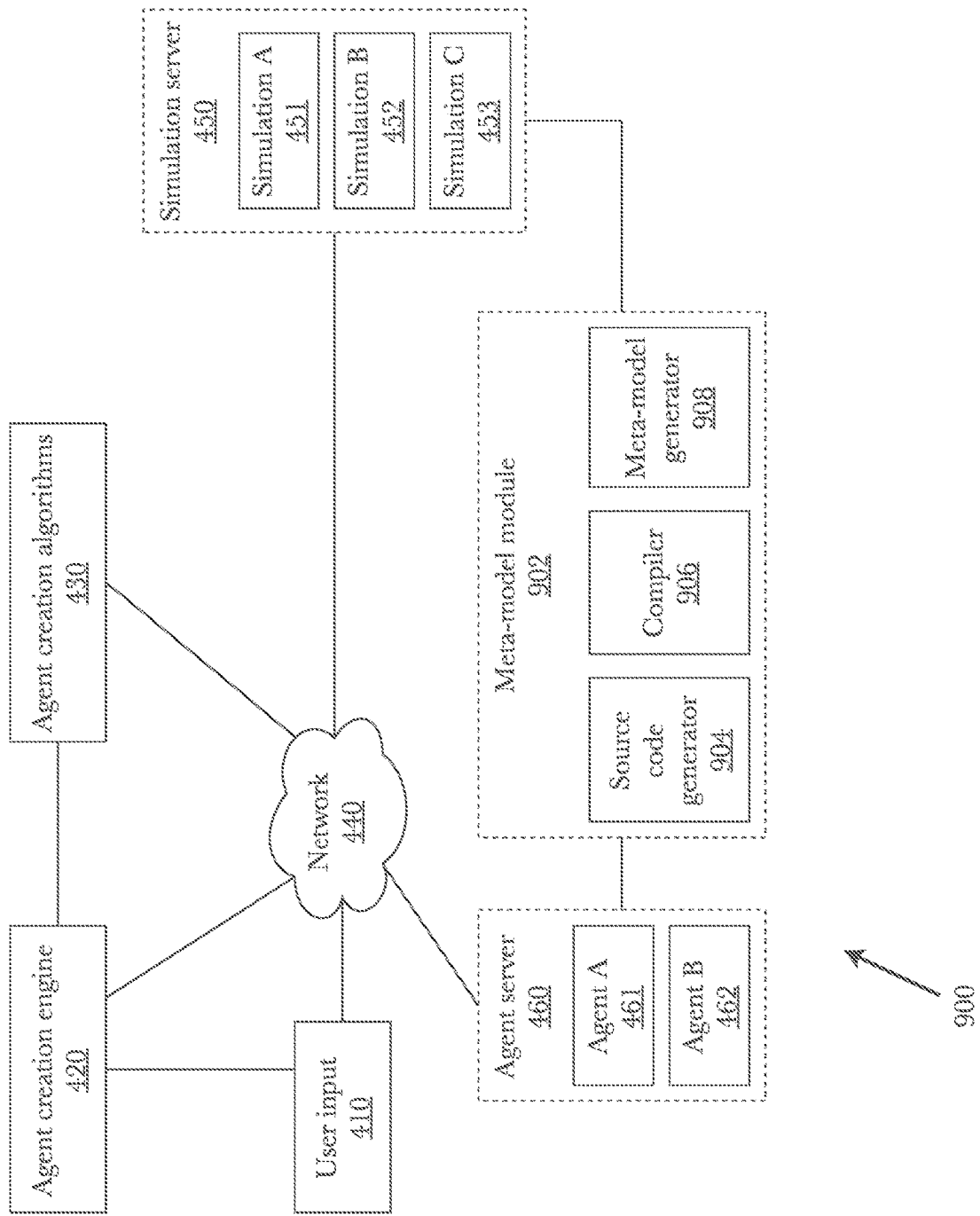
FIG. 9 is a diagram of an exemplary architecture of a system for meta-model creation for at least one simulated environment, but possibly several, across a network, according to a preferred aspect.

FIG. 9 is a diagram of an exemplary architecture of a system for meta-model creation for at least one simulated environment, but possibly several, across a network, according to a preferred aspect 900. The meta-models generated by a meta-model module 902 support direct, interpreted execution of the meta-models by a simulation manager residing on a simulation server 450. Meta-model module 902 comprises tools and components to create and deploy compiled code from the agents created in the agent creation environment 420/430. The generation environment of the meta-model module 902 includes a source code generator 904, compiler 906, and meta-model generator 908. A template creation tool and template repository may be included in the generation environment or provided as separate tools. Source code generator may use code generation templates to create application source code based on algorithms from the agent creation engine 420. Source code generator 904 provides source code which can be compiled by a compiler 906 and optionally tested using an integration test library within the generation environment if desired. Code generation templates created by a software developer may be stored in a template repository. Code generation templates define methods for creating source code of the agents. Templates are created by the software developer based on the agent creation models and algorithms 430. A template creation tool may be integrated into the code generation environment or may be a separate tool. In one embodiment, a template tool may comprise a text editor use to create templates. Templates support features necessary for building code from each of the agents, and thus the structure of the agents is available to the software developer. Template tools may include the ability to import agents to enable developers to understand the structure of the agents as necessary to create code generation templates.

A compiler 906 transforms source code created by the source code generator 904 into compiled code. Once two or more agents' have a respective compiled code, meta-model generator 908 reconfigures the at least two compiled codes into a meta-model. The meta-model describes all the relationships between the at least two agents. The compiled code of the meta-model is compiled code that may be used with one or more simulations in a simulation server 450.

Figure 10:
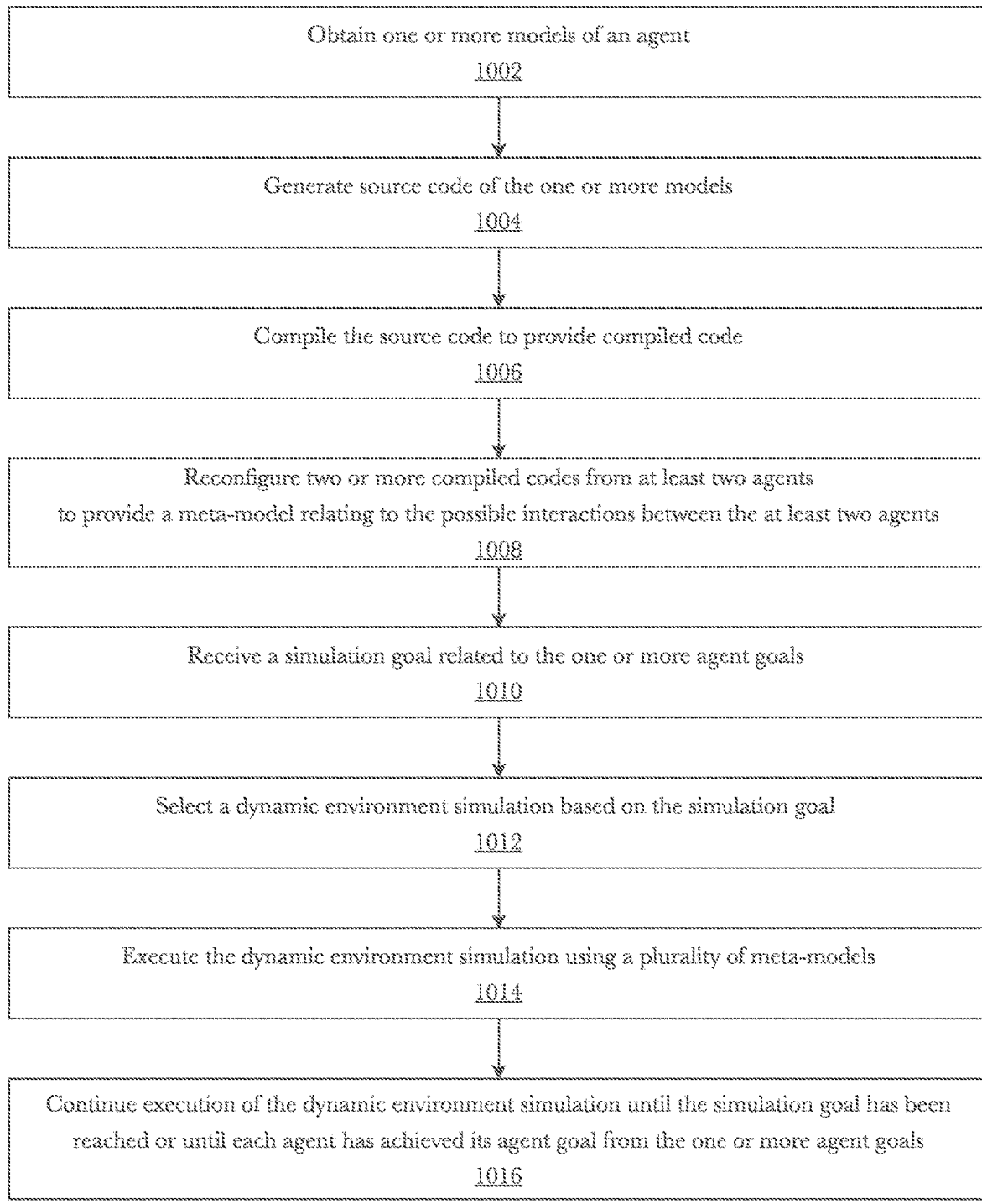
FIG. 10 is a method diagram illustrating meta-model creation for simulated environments, according to a preferred aspect.

FIG. 10 is a method diagram illustrating meta-model creation for simulated environments, according to a preferred aspect. In a first step 1002, models of agents are obtained from an agent server. Because meta-models are used to describe how two agents would interact in a simulation, it is typical to obtain at least two models, each model belonging to a respective agent, thus potentially performing steps 1002-1006 more than once. In a second step 1004, the models of the agents are used to generate source code that in turn is used in a third step 1006 to compile code, each step respective of each agent.

One suitable code generator comprises an open source platform for model driven software development known as openArchitectureWare. Where openArchitectureWare is an open source suite of tools and components assisting with model driven software development with a source code generator implemented in Java and supporting arbitrary import format metamodels and output code formats. openArchitectureWare includes tools for developing models based on an Eclipse modeling framework, and hence in one embodiment, the modeling environment and source code generator may be combined. In addition, openArchitectureWare includes a template tool capable of importing models in any of a number of modeling languages or formats which can then be used to create templates. In one implementation, the source code generator can read XMI models defined by the modeling framework and output source code based on templates created by the software developer.

With at least two compiled codes, each compiled code originating from a different agent, a meta-model is created 1008. Each meta-model may describe two or more possible interacts between agents. It is also possible to integrate the target simulation interaction rules in the meta-model to create meta-model templates. In a fifth step 1010, a simulation goal related to one or more agent goals are received and used in a sixth step 1012 to select a dynamic environment simulation based on the simulation goal. A seventh step 1014 comprises executing the dynamic environment simulation with the relevant meta-models that pertain to any agents operating within the dynamic environment simulation. In an eight step 1016, the execution of the dynamic environment simulation is continued. The simulation evolves with agent behavior from the execution of the plurality of agents and the plurality of meta-models until the simulation goal has been reached or until each agent has achieved its agent goal from the one or more agent goals.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit ("ASIC"), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 11:
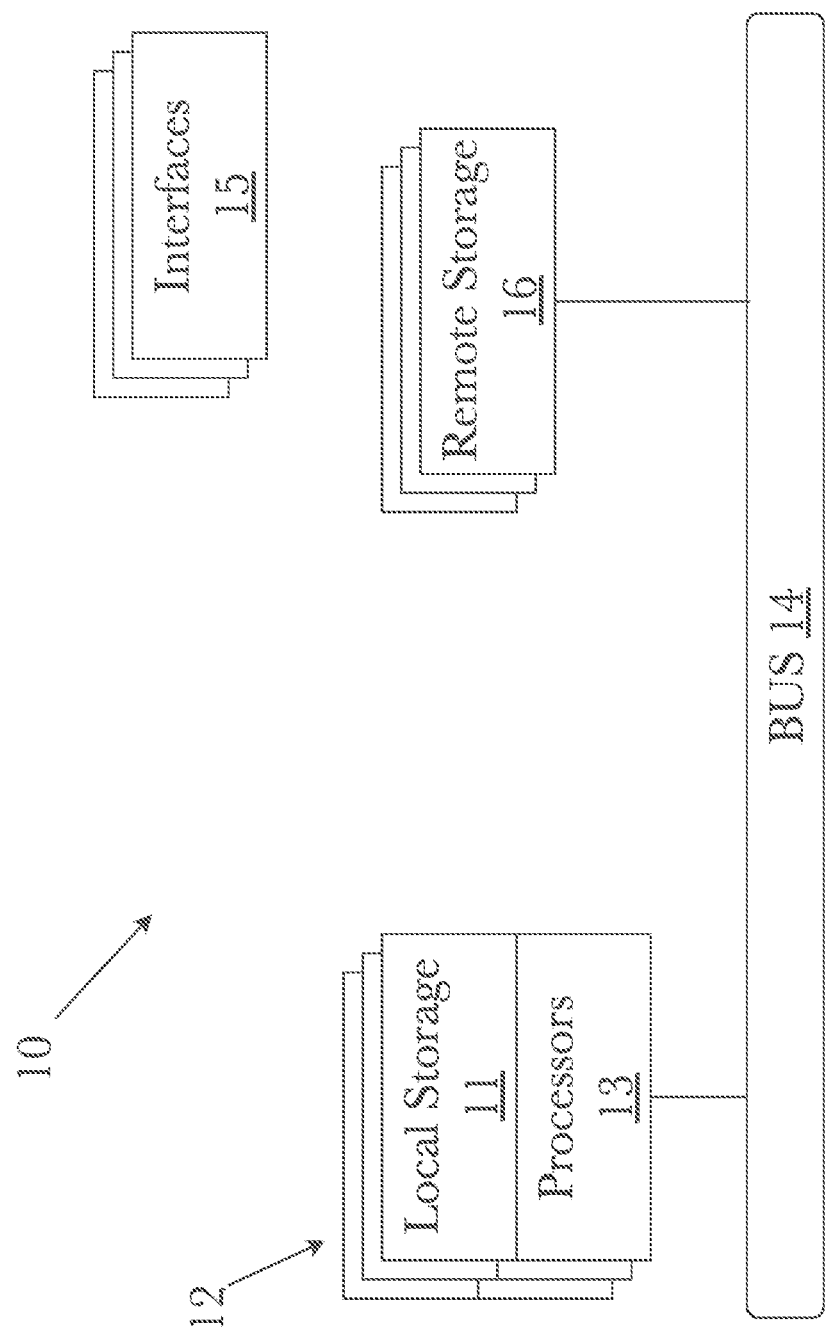
FIG. 11 is a block diagram illustrating an exemplary hardware architecture of a computing device.

Referring now to FIG. 11, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one embodiment, a computing device 10 may be configured or designed to function as a server system utilizing CPU 12, local memory 11 and/or remote memory 16, and interface(s) 15. In at least one embodiment, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a specific embodiment, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like.

It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (Wi-Fi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity AN hardware interfaces) and, in some instances, volatile and/or non-volatile memory (e.g., RAM).

Although the system shown in FIG. 11 illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one embodiment, a single processor 13 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 12:
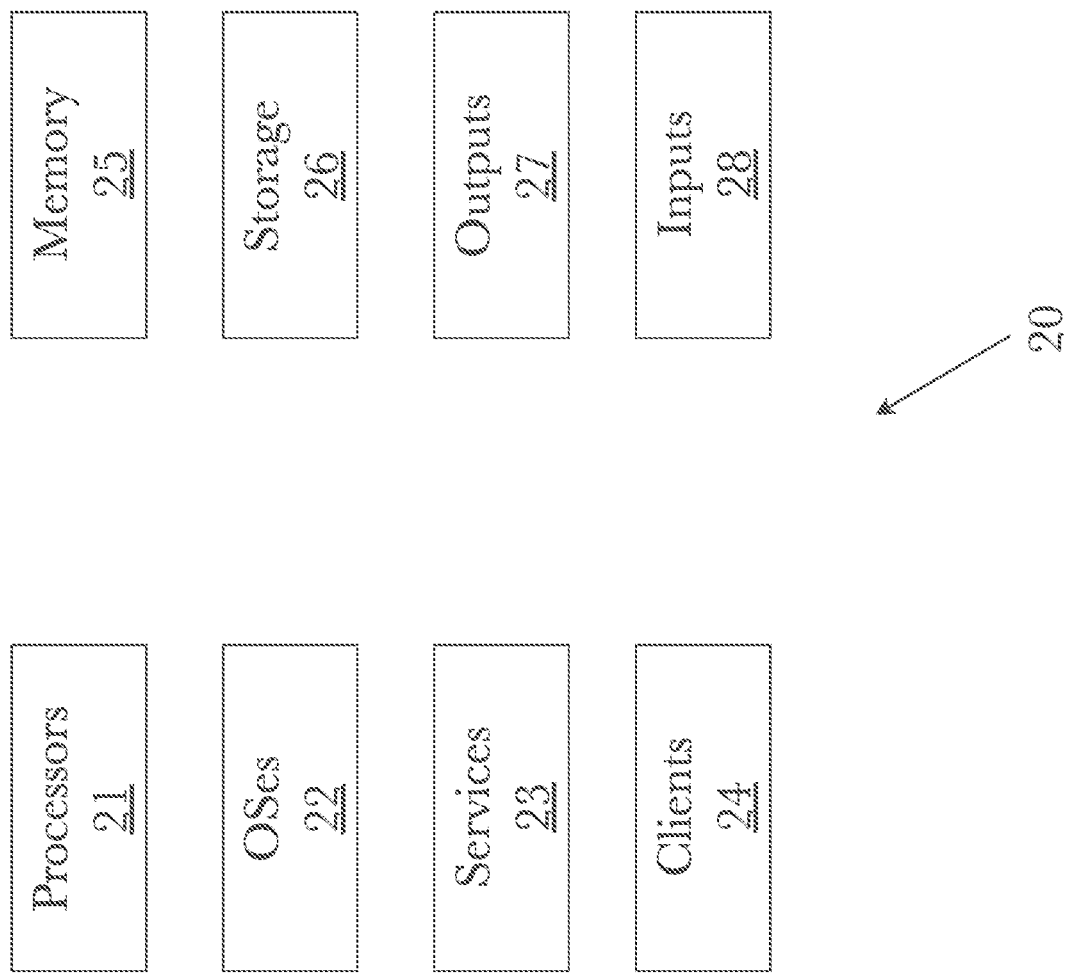
FIG. 12 is a block diagram illustrating an exemplary logical architecture for a client device.

In some embodiments, systems according to the present invention may be implemented on a standalone computing system. Referring now to FIG. 12, there is shown a block diagram depicting a typical exemplary architecture of one or more embodiments or components thereof on a standalone computing system. Computing device 20 includes processors 21 that may run software that carry out one or more functions or applications of embodiments of the invention, such as for example a client application 24. Processors 21 may carry out computing instructions under control of an operating system 22 such as, for example, a version of MICROSOFT WINDOWS™ operating system, APPLE OSX™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 11). Examples of storage devices 26 include flash memory, magnetic hard drive, CD-ROM, and/or the like.

Figure 13:
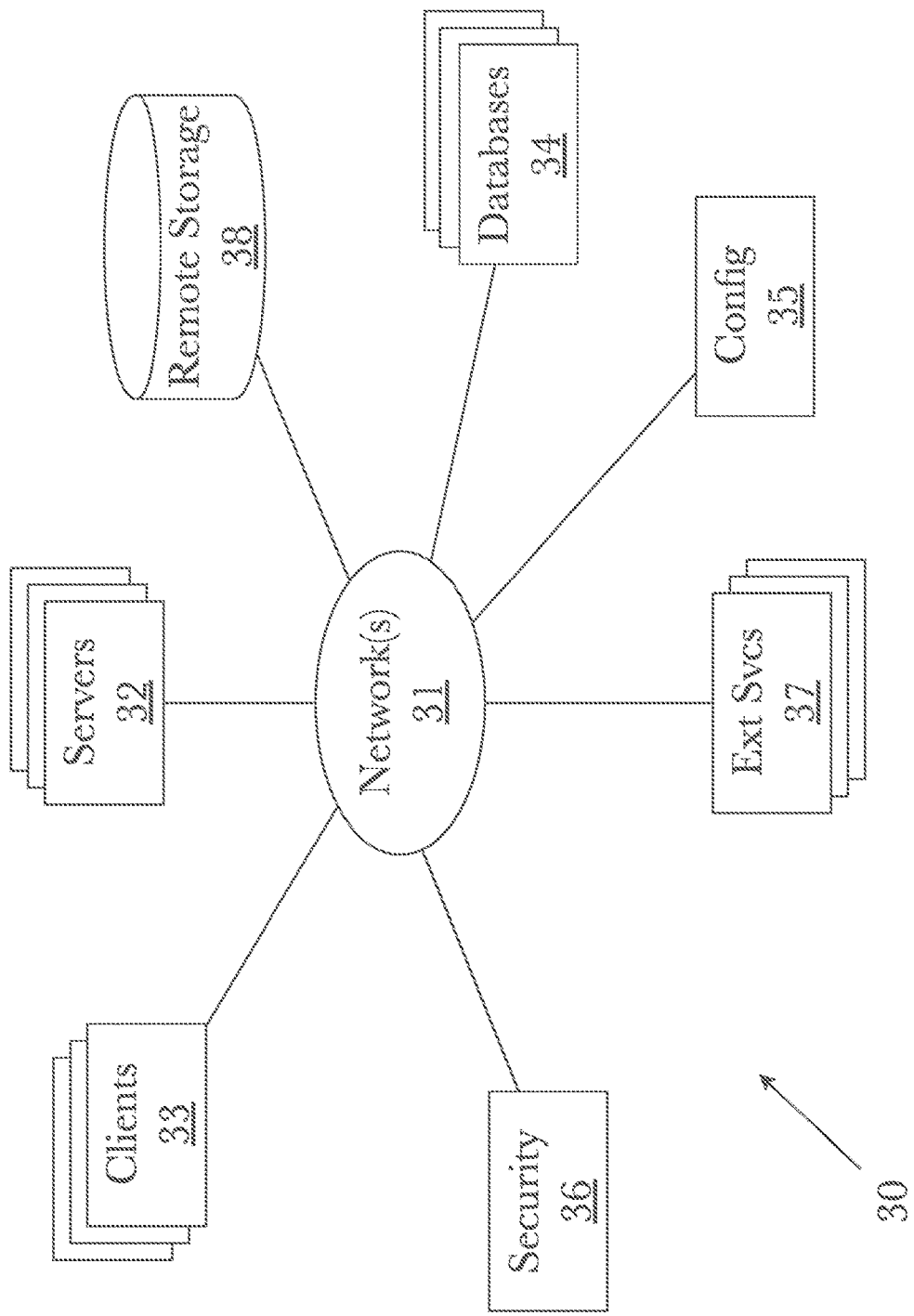
FIG. 13 is a block diagram showing an exemplary architectural arrangement of clients, servers, and external services.

In some embodiments, systems of the present invention may be implemented on a distributed computing network, such as one having any number of clients and/or servers. Referring now to FIG. 13, there is shown a block diagram depicting an exemplary architecture 30 for implementing at least a portion of a system according to an embodiment of the invention on a distributed computing network. According to the embodiment, any number of clients 33 may be provided. Each client 33 may run software for implementing client-side portions of the present invention; clients may comprise a system 20 such as that illustrated in FIG. 12. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as Wi-Fi, WiMAX, LTE, and so forth), or a local area network (or indeed any network topology known in the art; the invention does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in an embodiment where client applications 24 are implemented on a smartphone or other electronic device, client applications 24 may obtain information stored in a server system 32 in the cloud or on an external service 37 deployed on one or more of a particular enterprise's or user's premises.

In some embodiments of the invention, clients 33 or servers 32 (or both) may make use of one or more specialized services or appliances that may be deployed locally or remotely across one or more networks 31. For example, one or more databases 34 may be used or referred to by one or more embodiments of the invention. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most embodiments of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 36 or configuration system 35 or approach is specifically required by the description of any specific embodiment.

Figure 14:
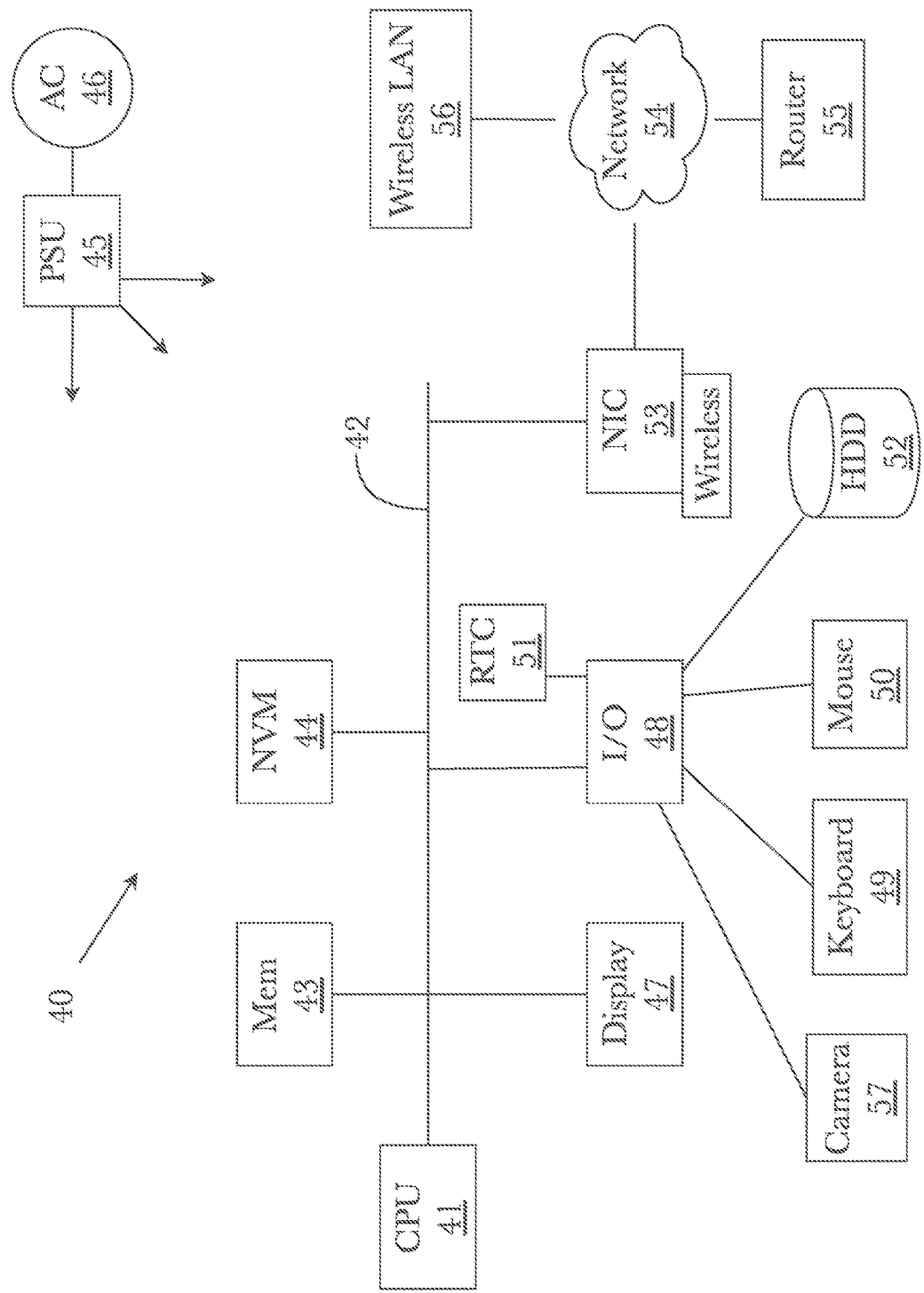
FIG. 14 is another block diagram illustrating an exemplary hardware architecture of a computing device.

FIG. 14 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of the present invention may be distributed among any number of client and/or server components. For example, various software modules may be implemented for performing various functions in connection with the present invention, and such modules may be variously implemented to run on server and/or client components.

The skilled person will be aware of a range of possible modifications of the various embodiments described above. Accordingly, the present invention is defined by the claims and their equivalents.

What is claimed is:

1. A system for generating meta-models in simulated environments, comprising:
   a computing device comprising a memory and a processor;
   a meta-model module comprising a first plurality of programming instructions stored in the memory and operating on the processor, wherein the first plurality of programming instructions, when operating on the processor, cause the computing device to:
   obtain one or more models of an agent; generate source code of the one or more models of an agent;
   compile the source code to provide compiled code; and
   reconfigure two or more compiled codes from at least two agents to provide a meta-model relating to a plurality of interactions between the at least two agents; and
   at least one simulation manager comprising a second plurality of programming instructions stored in the memory and operating on the processor, wherein the second plurality of programming instructions, when operating on the processor, cause the computing device to:
   receive a simulation goal related to one or more agent goals;
   select a dynamic environment simulation based on the simulation goal;
   execute the dynamic environment simulation using a plurality of meta-models; and
   continue the execution of the dynamic environment simulation that evolves with agent behavior from the execution of the plurality of agents and the plurality of meta-models until the simulation goal has been reached or until each agent has achieved its agent goal from the one or more agent goals; and
   an agent creation engine comprising a third plurality of programming instructions stored in the memory and operating on the processor, wherein the third plurality of programming instructions, when operating on the processor, cause the computing device to
   create a plurality of agents, wherein each agent is an individual instance based on the one or more models of an agent;
   assign at least one agent goal to each created agent; and
   provide the created agents for use in the execution of the dynamic environment simulation;
   wherein each of the plurality of agents takes different actions in a non-deterministic environment based on its specifications and the specifications of the dynamic environment simulation to achieve the one or more agent goals;
   wherein the different actions and learned behaviors acquired by individual agents further differentiating them from each other during the simulation execution.

2. The system of claim 1, wherein the agent creation engine operates on a simulation execution server.

3. The system of claim 1, wherein the agent creation engine operates on a separate server from the simulation execution server.

4. A method for generating meta-models in simulated environments, comprising:
   obtaining one or more models of an agent;
   generating source code of the one or more models of an agent;
   compiling the source code to provide compiled code;

reconfiguring two or more compiled codes from at least two agents to provide a meta-model relating to a plurality of interactions between the at least two agents;

receiving a simulation goal related to one or more agent goals;

selecting a dynamic environment simulation based on the simulation goal;

executing the dynamic environment simulation using a plurality of meta-models; and continuing the execution of the dynamic environment simulation that evolves with agent behavior from the execution of the plurality of agents and the plurality of meta-models until the simulation goal has been reached or until each agent has achieved its agent goal from the one or more agent goals;

creating a plurality of agents, wherein each agent is an individual instance based on the one or more models of an agent;

assigning at least one agent goal to each created agent; and providing the created agents for use in the execution of the dynamic environment simulation;

wherein each of the plurality of agents takes different actions in a non-deterministic environment based on its specifications and the specifications of the dynamic environment simulation to achieve the one or more agent goals;

wherein the different actions and learned behaviors acquired by individual agents further differentiating them from each other during the simulation execution.

* * * * *